(12) United States Patent
Ogawa (10) Patent No.: US 7,994,843 B2
(45) Date of Patent: Aug. 9, 2011

(54) BOOST CIRCUIT

(75) Inventor: Tetsuya Ogawa, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 12/722,717

(22) Filed: Mar. 12, 2010

(65) Prior Publication Data

US 2011/0074614 A1   Mar. 31, 2011

(30) Foreign Application Priority Data

Mar. 12, 2009 (JP) .................... 2009-059666
Feb. 2, 2010 (JP) .................... 2010-021375

(51) Int. Cl.
*G05F 1/10* (2006.01)
(52) U.S. Cl. ...................... 327/536; 323/222
(58) Field of Classification Search .................. 327/536, 327/108, 333, 390, 589; 323/225, 222, 243, 323/282, 351, 284, 355; 336/192; 363/18, 363/50, 59, 60, 89, 21.12
See application file for complete search history.

(56) References Cited

U.S. PATENT DOCUMENTS

| 5,748,032 | A  | * | 5/1998  | Baek         | 327/536 |
| 6,157,242 | A  | * | 12/2000 | Fukui        | 327/536 |
| 7,042,275 | B2 | * | 5/2006  | Suwa et al.  | 327/536 |
| 7,123,067 | B2 | * | 10/2006 | Yasui et al. | 327/178 |
| 7,504,805 | B2 | * | 3/2009  | Nishida      | 323/222 |

FOREIGN PATENT DOCUMENTS

JP   2000-13197 A   1/2000
JP   2005-12944 A   1/2005

* cited by examiner

*Primary Examiner* — Lam T Mai
(74) *Attorney, Agent, or Firm* — Cantor Colburn LLP (57) ABSTRACT

A boost circuit is provided, which is configured to receive a bitstream signal, to boost the amplitude of the bitstream signal thus received, and to output the bitstream signal thus boosted. A first clock booster receives a clock signal, and boosts the amplitude of the clock signal. A second clock booster receives an inverted clock signal, and boosts the amplitude of the inverted clock signal. A switch receives the output signals of these two clock boosters, and selects the one output signal that is high level. A first capacitor is coupled to the output terminal of the switch. A level shifter level-shifts the high level of the bitstream signal to the voltage level that occurs at the first capacitor.

10 Claims, 6 Drawing Sheets

BOOST CIRCUIT

BACKGROUND OF THE INVENTION

1. Field of the Invention

The present invention relates to a boost circuit configured to boost the amplitude of a bitstream signal.

2. Description of the Related Art

Figure 1:
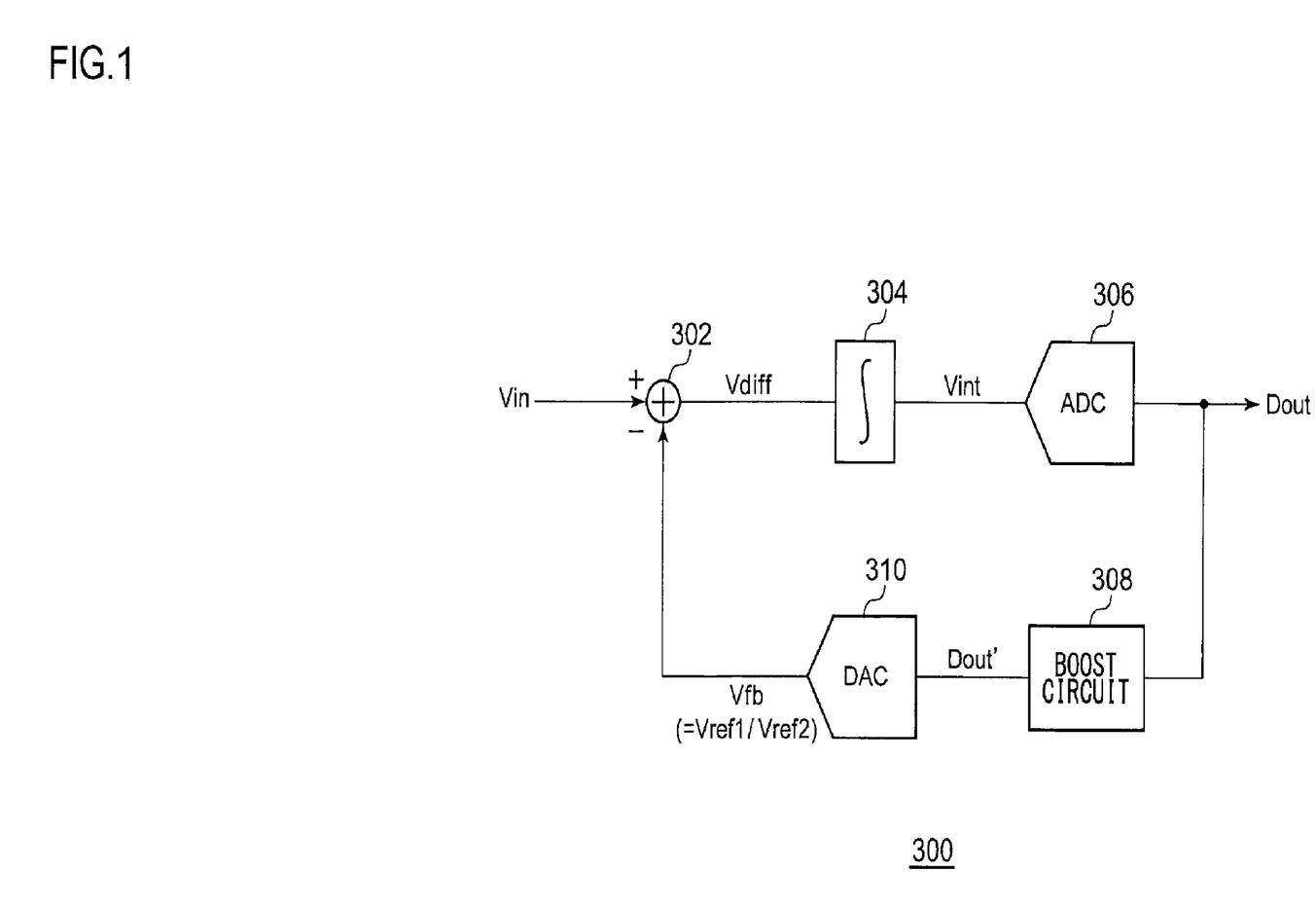
FIG. 1 is a block diagram which shows a configuration of a typical primary delta-sigma modulator.

Delta-sigma modulators configured to convert an analog voltage into a digital bitstream signal are known. FIG. 1 is a block diagram which shows a configuration of a typical primary delta-sigma modulator 300. The delta-sigma modulator 300 performs delta-sigma modulation on an analog input signal Vin so as to convert the analog input signal Vin into a digital bitstream signal Dout.

A boost circuit 308 boosts the amplitude of the bitstream signal Dout approximately twofold, for example. A digital/analog conversion circuit (DAC) 310 is a 1-bit DAC, which judges whether the bitstream signal Dout' thus boosted is low level or high level. When the bitstream signal Dout' is high level, the digital/analog conversion circuit 310 outputs a feedback signal Vfb at a reference voltage Vref1, and when the bitstream signal Dout' is low level, the digital/analog conversion circuit 310 outputs a feedback signal Vfb at a reference voltage Vref2. An adder 302 generates a difference voltage Vdiff, which is obtained by subtracting the feedback voltage Vfb from the input voltage Vin. An integrator 304 integrates the difference voltage Vdiff. An analog/digital conversion circuit (ADC) 306 converts the output signal Vint of the integrator 304 into a binary bitstream signal Dout.

RELATED ART DOCUMENTS

Patent Documents

[Patent Document 1]
   Japanese Patent Application Laid Open No. 2005-12944
[Patent Document 2]
   Japanese Patent Application Laid Open No. 2000-13197

With such a delta-sigma modulator 300, if an error occurs in the boosting operation of the boost circuit 308, i.e., in a case in which mismatching occurs per bit between the bitstream Dout before boosting and the bitstream Dout after boosting, there is divergence in the output voltage Vint of the integrator 304. Such bit error is also undesirable in signal processing systems other than delta-sigma modulators.

SUMMARY OF THE INVENTION

The present invention has been made in order to solve such a problem. Accordingly, it is an exemplary purpose of an embodiment of the present invention to provide a boost circuit configured to boost the amplitude of the bitstream without error occurrence.

An embodiment of the present invention relates a boost circuit configured to receive a bitstream signal, to boost the amplitude of the bitstream signal thus received, and to output the bitstream signal thus boosted. The boost circuit comprises: a first clock booster configured to receive a clock signal, and to boost the amplitude of the clock signal thus received; a second clock booster configured to receive an inverted clock signal, and to boost the amplitude of the inverted clock signal; a switch configured to receive output signals of the first and second clock boosters, and to select one signal that is high level from among the output signals thus received; a first capacitor coupled to an output terminal of the switch; and a level shifter configured to level-shift the high level of the bitstream signal to the voltage level that occurs at the first capacitor.

With such an embodiment, the signal obtained by boosting the amplitude of the clock signal is applied to the first capacitor from alternately the first and second clock boosters, thereby generating boosted DC voltage. The level shifter circuit level-shifts (boosts) the bitstream signal using the voltage that occurs at the first capacitor, thereby preventing bit error.

Also, each of the first and second clock boosters may comprise: a first PMOS (P-channel Metal Oxide Semiconductor) transistor, a second capacitor, and a second PMOS transistor connected in series between a power supply terminal and an output terminal; a first NMOS (N-channel Metal Oxide Semiconductor) transistor provided between a connection node that connects the first PMOS transistor and the second capacitor and a ground terminal; a second NMOS transistor provided between the output terminal and the ground terminal; and a third PMOS transistor provided in parallel with the first PMOS transistor and the second capacitor. Also, a signal that corresponds to the clock signal may be applied to the gates of the first PMOS transistor, the second PMOS transistor, the first NMOS transistor, and the second NMOS transistor. Also, the gate of the third PMOS transistor may be connected to the output terminal.

Also, the switch may comprise: a fourth PMOS transistor provided between an output terminal of the first clock booster and one terminal of the first capacitor; and a fifth PMOS transistor provided between an output terminal of the second clock booster and the one terminal of the first capacitor. Also, the gate of the fourth PMOS transistor may be connected to the output terminal of the second clock booster. Also, the gate of the fifth PMOS transistor may be connected to the output terminal of the first clock booster.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 2:
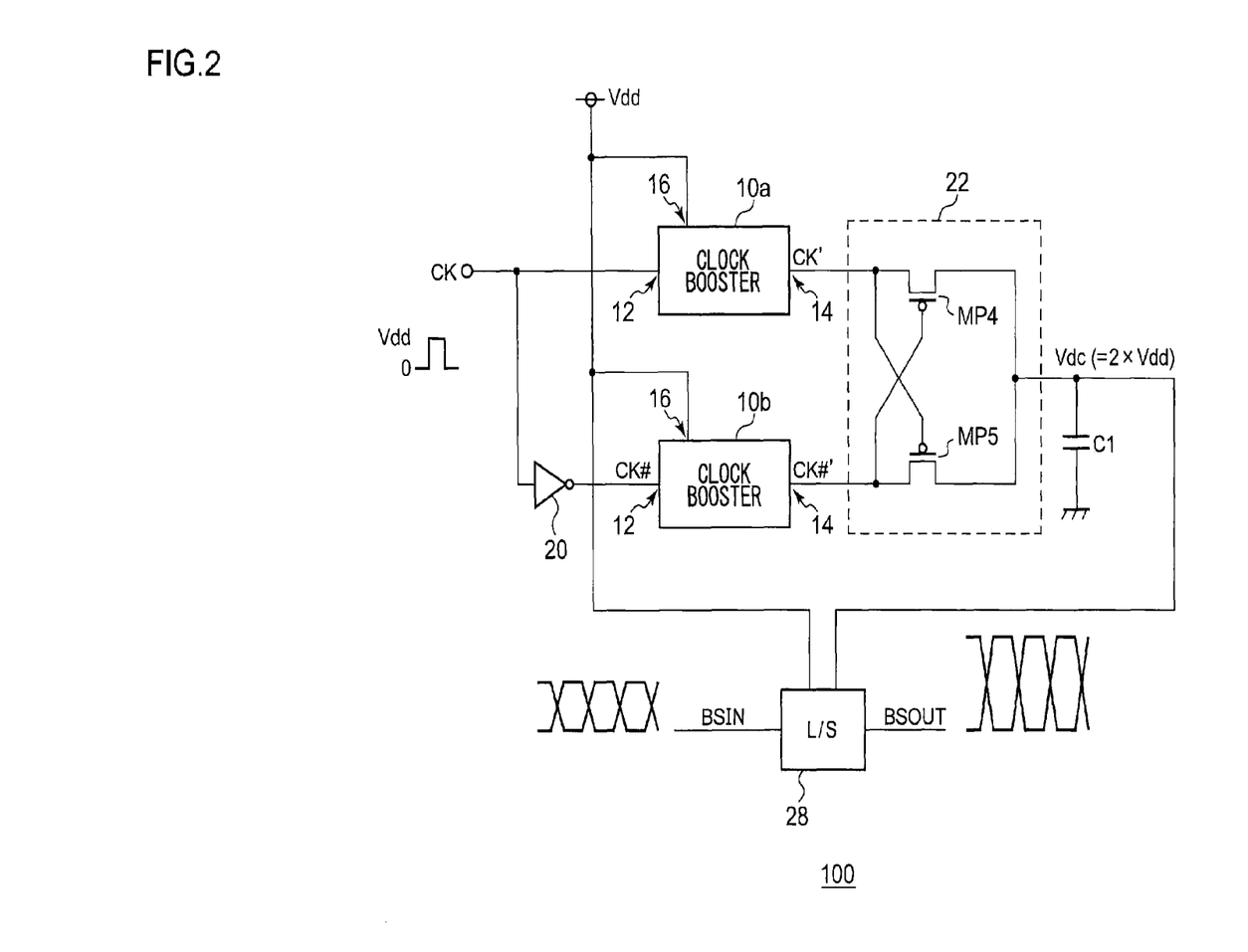
FIG. 2 is a block diagram which shows a configuration of a boost circuit according to an embodiment of the present invention.

FIG. 2 is a block diagram which shows a configuration of a boost circuit 100 according to an embodiment of the present invention. The boost circuit 100 receives a bitstream signal BSIN, boosts the amplitude of the bitstream signal BSIN, and outputs the bitstream signal BSIN thus boosted. The boost circuit 100 receives a power supply voltage Vdd and a clock signal CK, in addition to the bitstream signal BSIN. The frequency of the clock signal CK does not necessarily need to match the frequency of the bitstream signal BS. Accordingly, the system clock used in a device mounting the boost circuit 100 can be used as the clock signal CK.

The boost circuit 100 includes a first clock booster 10a, a second clock booster 10b, an inverter 20, a switch 22, a first capacitor C1, and a level shifter 28.

The first clock booster 10a receives the clock signal CK, and boosts the amplitude of the clock signal CK. The inverter 20 inverts the clock signal CK. The second clock booster receives the clock signal thus inverted (inverted clock signal) CK# ("#" represents logical inversion), and boosts the amplitude of the inverted clock signal CK#.

The switch 22 receives the clock signal (boosted clock signal) CK' thus boosted by the first clock booster 10a and the inverted clock signal (inverted boosted clock signal) CK#' thus boosted by the second clock booster 10b. The levels of the boosted clock signal CK' and the inverted boosted clock signal CK#' are complementary.

From among the complementary clock signals CK' and CK#', the switch 22 selects the signal that is high level, and outputs the clock signal thus selected to the first capacitor C1 coupled to the output terminal of the switch 22. That is to say, the output of the switch 22 is always set to the high level. Accordingly, the level of the voltage Vdc at the first capacitor C1 is equal to the amplitude level of the clock signals CK' and CK#' thus boosted.

The switch 22 includes a fourth PMOS transistor MP4 and a fifth PMOS transistor MP5. The fourth PMOS transistor MP4 is provided between the output terminal of the first clock booster 10a and one terminal of the first capacitor C1. The fifth PMOS transistor MP5 is provided between the output terminal of the second clock booster 10b and the aforementioned one terminal of the first capacitor C1. The gate of the fourth PMOS transistor MP4 is connected to the output terminal of the second clock booster 10b. The gate of the fifth PMOS transistor MP5 is connected to the output terminal of the first clock booster 10a. The switch 22 having such a configuration is capable of selecting one signal that is high level from among the two clock signals CK' and CK#'.

With such an arrangement, the clock signal CK is converted into a DC voltage Vdc by means of the first clock booster 10a, the second clock booster 10b, the switch 22, and the first capacitor C1. Where the amplitude level of the clock signal CK is Vdd, and in a case in which the first clock booster 10a and the second clock booster 10b boost the clock signal CK and CK# twofold, the level of the DC voltage Vdc is represented by (2×Vdd).

The level shifter 28 level-shifts the high level of the bitstream signal BSIN to the level of the DC voltage Vdc that occurs at the capacitor C1. The configuration of the level shifter 28 is not restricted in particular. The level shifter 28 may be configured using known techniques.

Next, description will be made regarding the configurations of the first clock booster 10a and the second clock booster 10b. The first clock booster 10a and the second clock booster 10b are identically configured.

Figure 3:
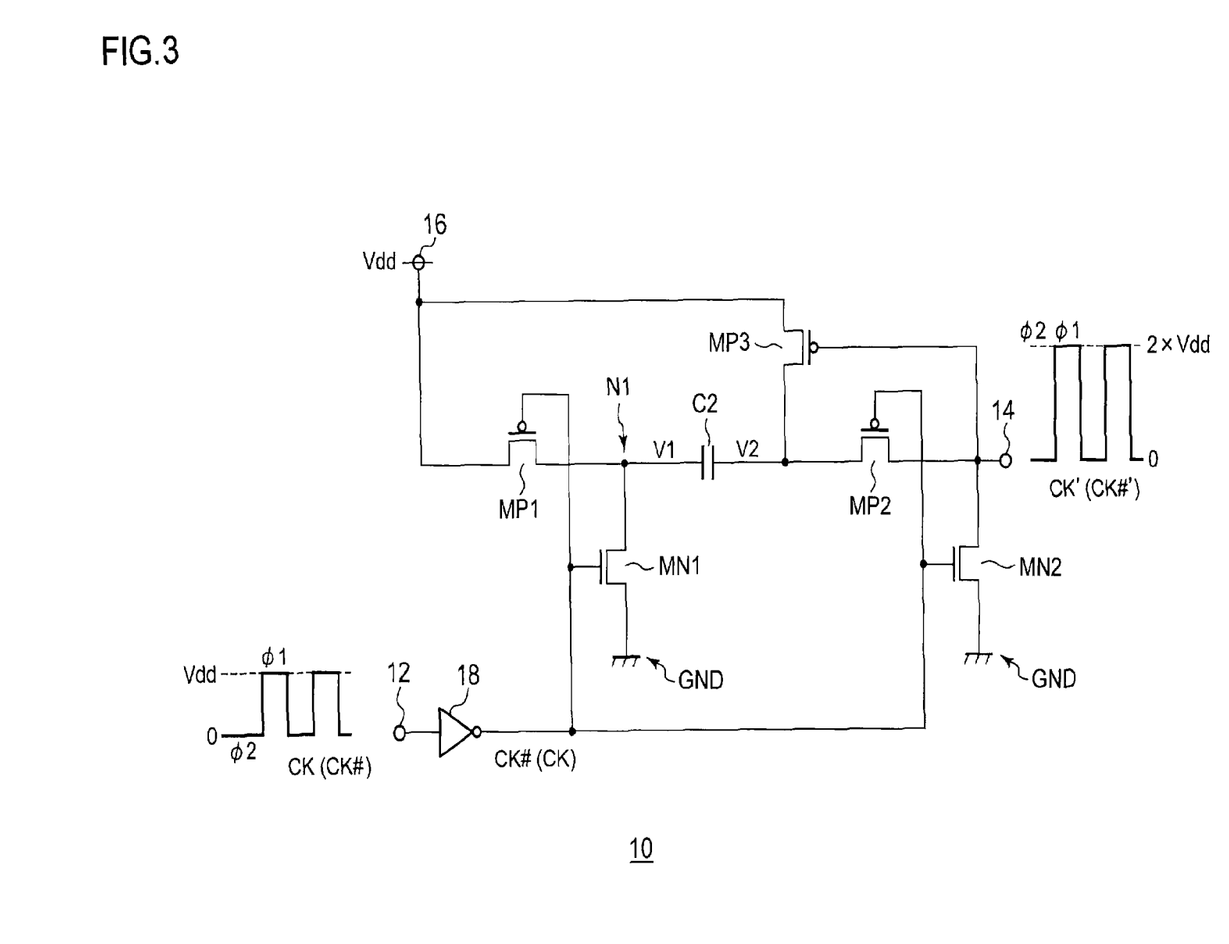
FIG. 3 is a circuit diagram which shows the configuration of a clock booster shown in FIG. 2.

FIG. 3 is a circuit diagram which shows the configuration of the clock booster 10 shown in FIG. 2. The clock booster 10 receives the power supply voltage Vdd via a power supply terminal 16 thereof, receives the clock signal CK (or CK#) via an input terminal 12 thereof, and outputs a boosted clock signal CK' (or CK#') via an output terminal 14 thereof.

A first PMOS transistor MP1, a second capacitor C2, and a second PMOS transistor MP2 are arranged in series in this order between the power supply terminal 16 and the output terminal 14. A first NMOS transistor MN1 is arranged between a connection node N1 that connects the first PMOS transistor MP1 and the second capacitor C2 and the ground terminal GND. A second NMOS transistor MN2 is provided between the output terminal 14 and the ground terminal GND. A third PMOS transistor MP3 is provided in parallel with a set of the first PMOS transistor MP1 and the second capacitor C2.

An inverter 18 inverts the clock signal CK. The signal CK# that corresponds to the clock signal CK is applied to the gates of the first PMOS transistor MP1, the second PMOS transistor MP2, the first NMOS transistor MN1, and the second NMOS transistor MN2. The gate of the third PMOS transistor MP3 is connected to the output terminal 14. The clock booster 10 repeatedly alternates between the following second state φ2 and first state φ1 according to the logical level of the clock signal CK.

Second State φ2

When the clock signal CK is low level, the PMOS transistors MP1 and MP2 are each switched OFF, and the NMOS transistors MN1 and MN2 and the PMOS transistor MP3 are each switched ON. In this state, the voltage V1 at one terminal of the second capacitor C2 is set to the ground voltage (0 V), and the voltage V2 at the other terminal of the second capacitor C2 is set to the power supply voltage Vdd. That is to say, the second capacitor C2 is charged, and the voltage difference ΔV between both terminals of the second capacitor C2 is set to the power supply voltage Vdd.

First State φ1

When the clock signal CK is high level, the NMOS transistors MN1 and MN2 and the PMOS transistor MP3 are each switched OFF, and the PMOS transistors MP1 and MP2 are each switched ON. In this state, the voltage V1 at the above-mentioned one terminal of the second capacitor C2 is shifted to the power supply voltage Vdd. Thus, the voltage V2 at the other terminal of the second capacitor C2 becomes Vdd+ΔV=2×Vdd.

Figure 4:
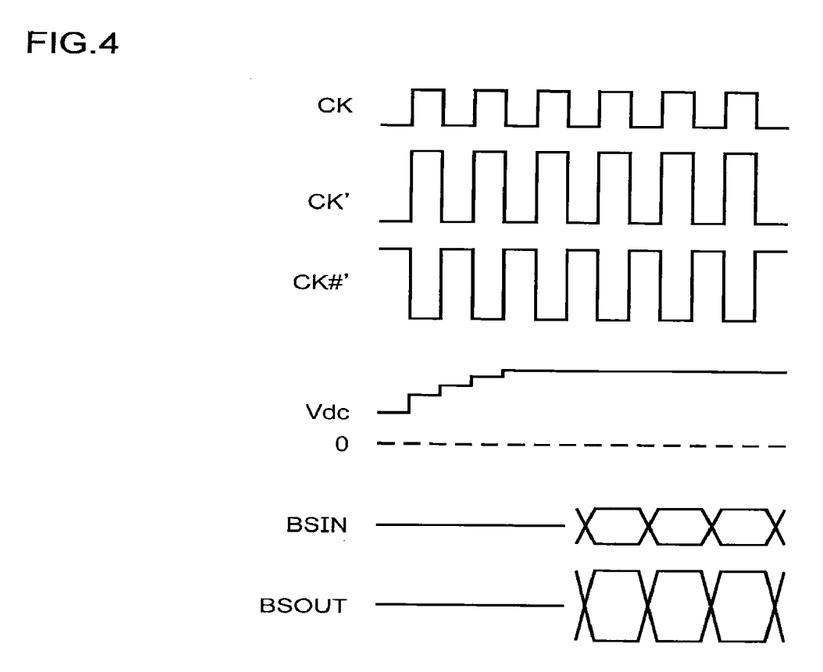
FIG. 4 is an operation waveform diagram for the boost circuit shown in FIG. 2.

The above is the configuration of the boost circuit 100. Next, description will be made regarding the operation thereof. FIG. 4 is a operation waveform diagram for the boost circuit 100 shown in FIG. 2. After the clock signal CK is input, the level of the DC voltage Vdc rises with time, and becomes 2×Vdd. Subsequently, the bitstream signal BSIN is input, and the amplitude level thereof is boosted to 2×Vdd, thereby generating the bitstream signal BSOUT.

Such a boost circuit 100 shown in FIG. 2 is capable of preventing bit mismatching between the bitstream signal BSIN and the bitstream signal BSOUT.

The bitstream signal BSIN is a binary signal which is either high level or low level. That is to say, the behavior of the bitstream signal BSIN is similar to that of the clock signal CK. Accordingly, an arrangement can be conceived in which the bitstream signal BSIN is boosted using the clock booster 10 shown in FIG. 3, without involving the boost circuit 100 shown in FIG. 2. However, such an arrangement in which the clock booster 10 shown in FIG. 10 is applied to an uneven bitstream signal BISN has the following problem.

As described above, the clock booster 10 repeatedly alternates between the first state φ1 and the second state φ2. With such an arrangement, in a case in which the first bit of the bitstream signal BSIN is low level, the clock booster 10 switches the state in order of the second state φ2 followed by the first state φ1. Accordingly, the bitstream signal BSIN is appropriately boosted, starting from the first bit. However, in a case in which the first bit is high level, the clock booster 10 switches the state in order of the first state φ1 followed by the second state φ2. Accordingly, the first bit cannot be boosted, leading to a problem in that the voltage level of the first bit is indefinite. This means that bit error occurs. The boost circuit 100 shown in FIG. 2 is capable of suitably solving this problem.

Figure 5:
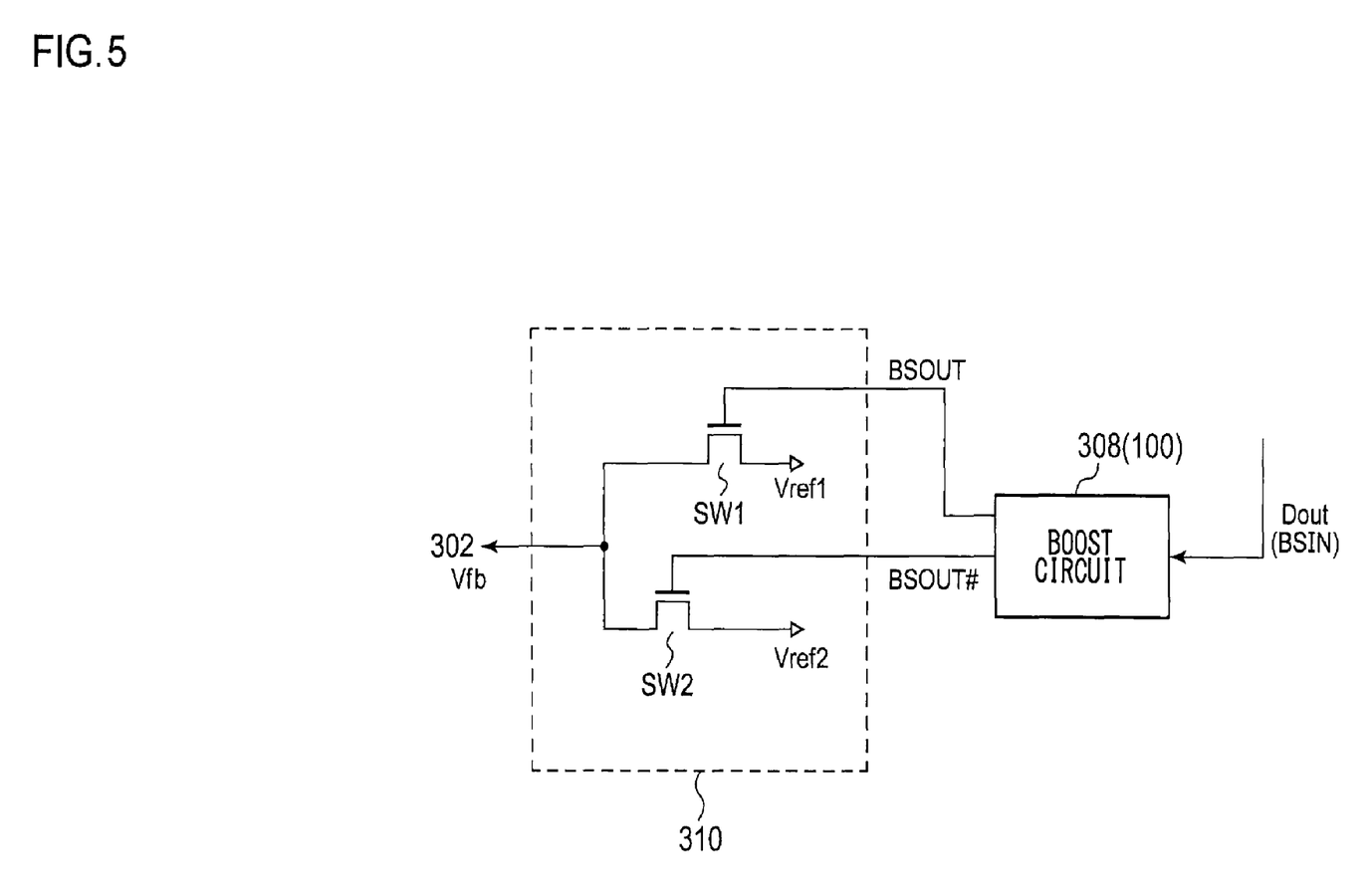
FIG. 5 is a block diagram which shows a portion of the configuration of a delta-sigma modulator employing the boost circuit shown in FIG. 2.

Next, description will be made regarding an application of the boost circuit 100 shown in FIG. 2. For example, the boost circuit 100 can be suitably employed as a boost circuit 308 in the delta-sigma modulator 300 shown in FIG. 1. FIG. 5 is a block diagram which shows a portion of the configuration of the delta-sigma modulator 300 employing the boost circuit 100 shown in FIG. 2. The boost circuit 308 (100) receives the bitstream signal Dout, and boosts the amplitude of the bitstream signal Dout thus received. The boost circuit 308 generates a boosted bitstream signal BSOUT, and a bitstream signal BSOUT# which is the logical inversion of the boosted bitstream signal BSOUT. For example, the boost circuit 100 shown in FIG. 2 further includes a second level shifter circuit (not shown) configured to level-shift the inverted bitstream signal BS#, thereby generating the inverted bitstream signal BSOUT#.

The DAC 310 shown in FIG. 5 includes two switches SW1 and SW2. Each of the switches SW1 and SW2 is configured as an NMOS transistor. One terminal of the first switch SW1 is connected to one terminal of the second switch SW2 so as to form a common terminal. The reference voltage Vref1 is applied to the other terminal of the first switch SW1, and the reference voltage Vref2 is applied to the other terminal of the second switch SW2. The boosted bitstream signal BSOUT is applied to the gate of the first switch SW1, and the boosted inverted bitstream signal BSOUT# is applied to the gate of the second switch SW2.

With such an arrangement, when the bitstream signal BSOUT is high level, the first switch SW1 is switched ON, thereby outputting the reference voltage Vref1, and when the bitstream signal BSOUT is low level, the second switch SW2 is switched ON, thereby outputting the reference voltage Vref2. As described above, the bitstream signal BSOUT matches the bitstream signal Dout (BSIN) in increments of bits, thereby providing precise delta-sigma modulation.

Figure 6:
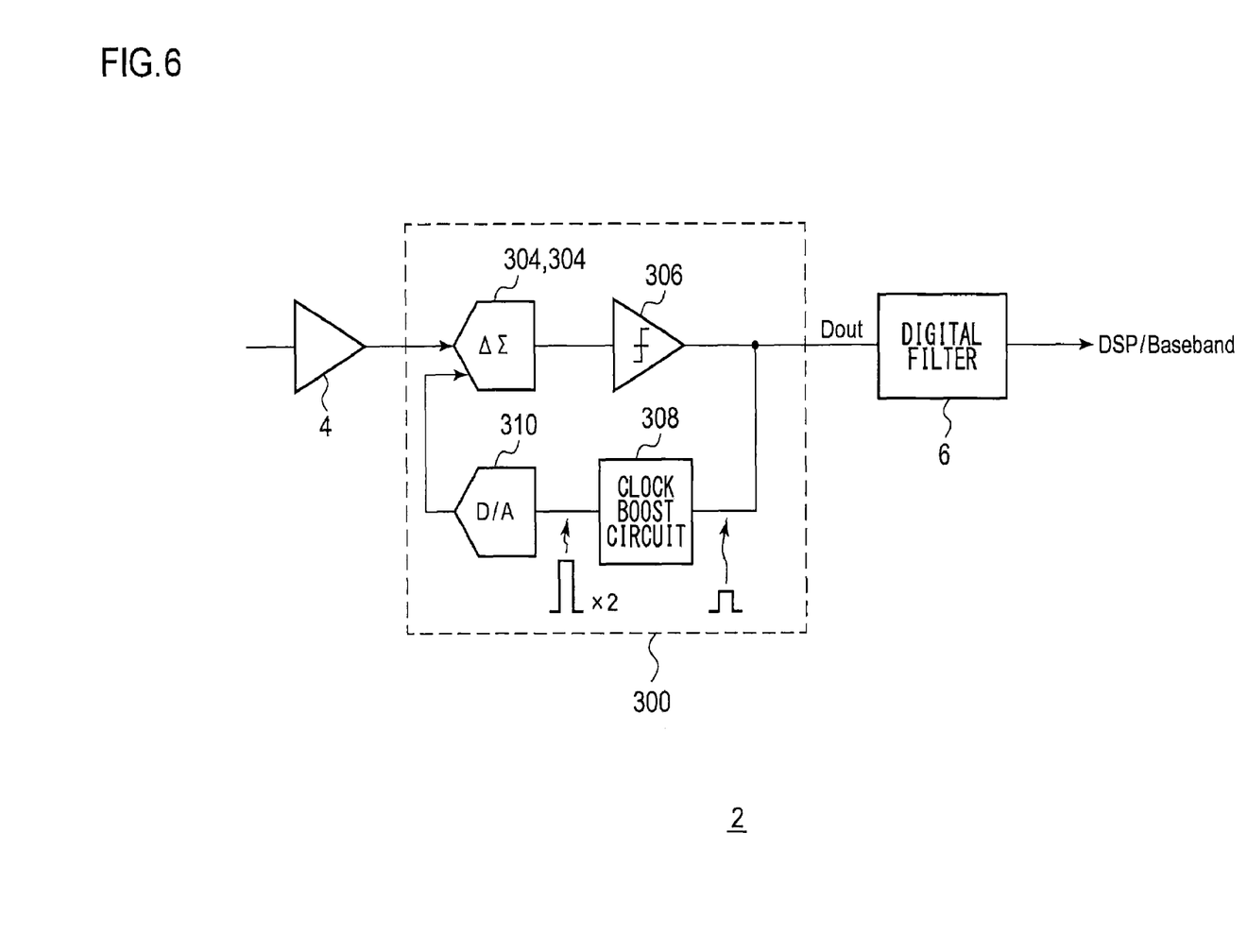
FIG. 6 is a block diagram which shows a configuration of an electronic device employing the delta-sigma modulator according to an embodiment.

FIG. 6 is a block diagram which shows a configuration of an electronic device employing a delta-sigma modulator according to the embodiment. An electronic device is configured to convert an analog audio signal into a digital signal, and has: (1) a function of transmitting the digital signal thus converted; (2) a function of storing the digital signal thus converted in a storage medium such as a hard disk, memory, or the like; (3) a function of supplying the digital signal thus converted to a digital amplifier (switching amplifier); or the like. Examples of such an electronic device include: (1) cellular phones, PHS devices, etc.; (2) digital video cameras, digital still cameras, voice recorders, DVD recorders, blu-ray recorders, etc.; and (3) audio players, audio amplifiers, etc.

The electronic device 2 further includes a pre-amplifier 4 and a digital filter 6, in addition to the delta-sigma modulator 300. The pre-amplifier 4 amplifies an analog audio signal, and supplies the analog audio signal thus amplified to the delta-sigma modulator 300. The delta-sigma modulator 300 performs delta-sigma modulation on the signal received from the pre-amplifier 4, thereby converting the analog audio signal thus received into a digital signal. The digital filter 6 performs filtering of the digital signal Dout, and supplies the digital signal Dout thus filtered to a downstream circuit block. A circuit block (not shown) that corresponds to the kind of electronic device 2 is arranged as a circuit block downstream of the delta-sigma modulator 300. Examples of such a downstream circuit block include DSPs (Digital Signal Processors), baseband circuits, digital amplifiers, and storage devices.

As described above, the delta-sigma modulator 300 according to the embodiment can be mounted on various kinds of electronic devices. The delta-sigma modulator 300 is useful for various applications, in addition to the electronic devices described above for exemplary purposes.

While the preferred embodiments of the present invention have been described using specific terms, such description is for illustrative purposes only, and it is to be understood that changes and variations may be made without departing from the spirit or scope of the appended claims.

What is claimed is:

1. A boost circuit configured to receive a bitstream signal, to boost the amplitude of the bitstream signal thus received, and to output the bitstream signal thus boosted, the boost circuit comprising:
    a first clock booster configured to receive a clock signal, and to boost the amplitude of the clock signal thus received;
    a second clock booster configured to receive an inverted clock signal, and to boost the amplitude of the inverted clock signal;
    a switch configured to receive output signals of the first and second clock boosters, and to select one signal that is high level from among the output signals thus received;
    a first capacitor coupled to an output terminal of the switch; and
    a level shifter configured to level-shift the high level of the bitstream signal to the voltage level that occurs at the first capacitor.

2. A boost circuit according to claim 1, wherein each of the first and second clock boosters comprises:
    a first PMOS (P-channel Metal Oxide Semiconductor) transistor, a second capacitor, and a second PMOS transistor connected in series between a power supply terminal and an output terminal;
    a first NMOS (N-channel Metal Oxide Semiconductor) transistor provided between a connection node that connects the first PMOS transistor and the second capacitor and a ground terminal;

a second NMOS transistor provided between the output terminal and the ground terminal; and
a third PMOS transistor provided in parallel with the first PMOS transistor and the second capacitor,
and wherein a signal that corresponds to the clock signal is applied to the gates of the first PMOS transistor, the second PMOS transistor, the first NMOS transistor, and the second NMOS transistor,
and wherein the gate of the third PMOS transistor is connected to the output terminal.

3. A boost circuit according to claim 1, wherein the switch comprises:
a fourth PMOS transistor provided between an output terminal of the first clock booster and one terminal of the first capacitor; and
a fifth PMOS transistor provided between an output terminal of the second clock booster and the one terminal of the first capacitor,
and wherein the gate of the fourth PMOS transistor is connected to the output terminal of the second clock booster,
and wherein the gate of the fifth PMOS transistor is connected to the output terminal of the first clock booster.

4. A boost circuit according to claim 2, wherein the switch comprises:
a fourth PMOS transistor provided between an output terminal of the first clock booster and one terminal of the first capacitor; and
a fifth PMOS transistor provided between an output terminal of the second clock booster and the one terminal of the first capacitor,
and wherein the gate of the fourth PMOS transistor is connected to the output terminal of the second clock booster,
and wherein the gate of the fifth PMOS transistor is connected to the output terminal of the first clock booster.

5. A delta-sigma modulator configured to convert an analog input voltage into a digital bitstream signal, the delta-sigma modulator comprising:
a boost circuit according to claim 1, configured to boost the amplitude of the bitstream signal;
a digital/analog conversion circuit configured to generate an analog feedback voltage that corresponds to the level of the bitstream thus boosted by the boost circuit;
an adder configured to generate a difference voltage that corresponds to the difference between the input voltage and the feedback voltage;
an integrator configured to integrate the difference voltage; and
an analog/digital conversion circuit configured to compare the output voltage output from the integrator with a threshold value so as to convert the output voltage into a binary bitstream signal.

6. A delta-sigma modulator configured to convert an analog input voltage into a digital bitstream signal, the delta-sigma modulator comprising:
a boost circuit according to claim 2, configured to boost the amplitude of the bitstream signal;
a digital/analog conversion circuit configured to generate an analog feedback voltage that corresponds to the level of the bitstream thus boosted by the boost circuit;
an adder configured to generate a difference voltage that corresponds to the difference between the input voltage and the feedback voltage;
an integrator configured to integrate the difference voltage; and
an analog/digital conversion circuit configured to compare the output voltage output from the integrator with a threshold value so as to convert the output voltage into a binary bitstream signal.

7. A delta-sigma modulator according to claim 5, wherein the digital/analog conversion circuit comprises a first switch and a second switch, each of which is an NMOS transistor,
and wherein a first reference voltage is applied to one terminal of the first switch, and a second reference voltage is applied to one terminal of the second switch,
and wherein the boosted bitstream signal is input to the gate of the first switch, and the boosted inverted bitstream signal is input to the gate of the second switch,
and wherein the other terminal of the first switch is connected to the other terminal of the second switch so as to form a common terminal, and the voltage at the common terminal thus formed is output as the feedback voltage.

8. A delta-sigma modulator according to claim 6, wherein the digital/analog conversion circuit comprises a first switch and a second switch, each of which is an NMOS transistor,
and wherein a first reference voltage is applied to one terminal of the first switch, and a second reference voltage is applied to one terminal of the second switch,
and wherein the boosted bitstream signal is input to the gate of the first switch, and the boosted inverted bitstream signal is input to the gate of the second switch,
and wherein the other terminal of the first switch is connected to the other terminal of the second switch so as to form a common terminal, and the voltage at the common terminal thus formed is output as the feedback voltage.

9. An electronic device comprising:
a pre-amplifier configured to amplify an analog signal;
a delta-sigma modulator according to claim 7, configured to perform delta-sigma modulation on the output signal of the pre-amplifier; and
a digital filter configured to perform filtering of the output signal of the delta-sigma modulator.

10. An electronic device comprising:
a pre-amplifier configured to amplify an analog signal;
a delta-sigma modulator according to claim 8, configured to perform delta-sigma modulation on the output signal of the pre-amplifier; and
a digital filter configured to perform filtering of the output signal of the delta-sigma modulator.

* * * * *